United States Patent
Kawashima et al.

(10) Patent No.: US 12,102,015 B2
(45) Date of Patent: Sep. 24, 2024

(54) PRECURSOR FOR USE IN MANUFACTURING SUPERCONDUCTING WIRE, PRODUCTION METHOD OF PRECURSOR, AND SUPERCONDUCTING WIRE

(71) Applicant: Kobe Steel, Ltd., Kobe (JP)

(72) Inventors: Shinya Kawashima, Kobe (JP); Takao Kawarada, Kobe (JP)

(73) Assignee: Kobe Steel, Ltd., Kobe (JP)

( * ) Notice: Subject to any disclaimer, the term of this patent is extended or adjusted under 35 U.S.C. 154(b) by 693 days.

(21) Appl. No.: 17/284,964

(22) PCT Filed: Oct. 25, 2019

(86) PCT No.: PCT/JP2019/042066
§ 371 (c)(1),
(2) Date: Apr. 13, 2021

(87) PCT Pub. No.: WO2020/095734
PCT Pub. Date: May 14, 2020

(65) Prior Publication Data
US 2021/0359191 A1    Nov. 18, 2021

(30) Foreign Application Priority Data
Nov. 9, 2018    (JP) ................................ 2018-211791

(51) Int. Cl.
H10N 60/01 (2023.01)
(52) U.S. Cl.
CPC ..... H10N 60/0772 (2023.02); H10N 60/0184 (2023.02)

(58) Field of Classification Search
CPC ............ H10N 60/0772; H10N 60/0184; Y02E 40/60; Y10T 29/49014
See application file for complete search history.

(56) References Cited

U.S. PATENT DOCUMENTS

| 6,251,529 | B1 | 6/2001 | Kubo | |
| 8,778,841 | B2 * | 7/2014 | Wadayama | ........ H10N 60/0184 505/510 |

(Continued)

FOREIGN PATENT DOCUMENTS

| JP | 3-84815 A | 4/1991 |
| JP | 2010-15821 A | 1/2010 |
| JP | 2018-147842 A | 9/2018 |

OTHER PUBLICATIONS

Extended European Search Report issued Jun. 30, 2022 in European Patent Application No. 19882072.2, 9 pages.

*Primary Examiner* — Donghai D Nguyen
(74) *Attorney, Agent, or Firm* — Oblon, McClelland, Maier & Neustadt, L.L.P.

(57) ABSTRACT

A precursor, which is a drawn wire product of a composite pipe, the composite pipe having: a composite wire group; a barrier layer; and a protective layer, wherein the composite wire group has: a plurality of tin wires each having at least one tin core being made of tin or a tin alloy, and a copper matrix which surrounds the at least one tin core; and a plurality of niobium wires each having a plurality of niobium cores being made of niobium or a niobium alloy, and a copper matrix which surrounds the plurality of niobium cores, the plurality of niobium wires being disposed such that each of the tin wires is surrounded by the niobium wires, the composite wire group contains titanium in an amount of from 0.38% by mass to 0.55% by mass.

17 Claims, 2 Drawing Sheets

(56) References Cited

U.S. PATENT DOCUMENTS

| | | | |
|---|---|---|---|
| 10,049,793 B2* | 8/2018 | Aimone | H10N 60/0184 |
| 2006/0289836 A1* | 12/2006 | Egawa | H10N 60/0184 |
| | | | 505/230 |
| 2007/0186998 A1 | 8/2007 | Kato et al. | |
| 2012/0108437 A1 | 5/2012 | Ohata et al. | |
| 2012/0149579 A1 | 6/2012 | Wadayama et al. | |
| 2014/0221215 A1 | 8/2014 | Wadayama et al. | |

* cited by examiner

PRECURSOR FOR USE IN MANUFACTURING SUPERCONDUCTING WIRE, PRODUCTION METHOD OF PRECURSOR, AND SUPERCONDUCTING WIRE

CROSS-REFERENCE TO RELATED APPLICATIONS

The present application is the national stage of international application PCT/JP2019/042066, filed on Oct. 25, 2019, and claims the benefit of the filing date of Japanese Appl. No. 2018-211791, filed on Nov. 9, 2018.

TECHNICAL FIELD

The present invention relates to a precursor to be used in manufacturing a superconducting wire, a production method of a precursor, and a superconducting wire.

BACKGROUND ART

In a nuclear magnetic resonance apparatus (NMR apparatus), a magnetic resonance imaging apparatus (MRI apparatus), a nuclear fusion reactor, an accelerator, and the like, a superconducting electromagnet is used to generate a strong magnetic field. In recent years, due to such a superconducting magnet being required to have an increase in performance and a reduction in size, a superconducting wire for the superconducting magnet is also required to increase: a critical magnetic field, and a critical current density in order to generate the strong magnetic field. Conventionally, a $Nb_3Sn$ superconducting wire is used as the superconducting wire which enables generation of the strong magnetic field.

As a manufacturing method of the $Nb_3Sn$ superconducting wire, a bronze process and an internal tin process have been proposed. In this regard, the "internal tin process" means a method in which $Nb_3Sn$ is generated by conducting a heat treatment on a precursor of a superconducting wire in which a niobium core and a tin core are arranged such that the niobium core and the tin core do not come into contact with each other in a copper matrix, and allowing tin dispersed in the copper matrix to react with niobium. In light of efficiency of generating $Nb_3Sn$ and cost of conducting the heat treatment on the wire, the internal tin process is known to be advantageous compared to the bronze method.

As a precursor to be used in the internal tin process, a precursor in which a niobium wire including a niobium core embedded in a copper matrix is combined with a tin wire not having a copper matrix on a surface of tin has been proposed (see Japanese Unexamined Patent Application, Publication No. 2010-15821). It is asserted that by this conventional precursor, a decreased volume of the copper matrix in the precursor enables an improvement of the critical current density of a $Nb_3Sn$ superconducting wire.

Furthermore, a precursor in which a copper matrix and a plurality of niobium cores are arranged around a tin core has also been proposed (see Japanese Unexamined Patent Application, Publication No. 2007-214002). It is asserted that by this conventional precursor, improving the critical current density of a $Nb_3Sn$ superconducting wire is enabled due to making a wire diameter of the niobium cores in the precursor greater than or equal to 5 and less than or equal to 30 μm, and making an average distance from the tin core to the niobium cores present in the nearest vicinity to the tin core less than or equal to 100 μm.

These conventional precursors improve the critical current density of the $Nb_3Sn$ superconducting wire by relatively increasing a volume ratio of niobium in the precursor, but there is a requirement for a further improvement in the critical current density of the superconducting wire, particularly in the critical current density in a strong magnetic field.

PRIOR ART DOCUMENTS

Patent Documents

Patent Document 1: Japanese Unexamined Patent Application, Publication No. 2010-15821
Patent Document 2: Japanese Unexamined Patent Application, Publication No. 2007-214002

SUMMARY OF THE INVENTION

Problems to be Solved by the Invention

The present invention was made in view of the foregoing circumstances, and an object of the present invention is to provide: a precursor to be used in manufacturing a superconducting wire, the precursor enabling obtaining a superconducting wire having improved critical current density; a production method of the precursor; and a superconducting wire having improved critical current density.

Means for Solving the Problems

An aspect of the invention made for solving the aforementioned problems is a precursor to be used in manufacturing a $Nb_3Sn$ superconducting wire by an internal tin process, the precursor being a drawn wire product of a composite pipe,
the composite pipe having:
  a composite wire group;
  a cylindrical barrier layer being disposed such that the cylindrical barrier layer surrounds the composite wire group to prevent permeation of tin; and
  a cylindrical protective layer covering an outer circumferential surface of the cylindrical barrier layer,
wherein
the composite wire group has:
  a plurality of tin wires each having at least one tin core being made of tin or a tin alloy, and a copper matrix which surrounds the at least one tin core; and
  a plurality of niobium wires each having a plurality of niobium cores being made of niobium or a niobium alloy, and a copper matrix which surrounds the plurality of niobium cores, the plurality of niobium wires being disposed such that each of the tin wires is surrounded by the niobium wires,
the composite wire group contains titanium, and a content of titanium is greater than or equal to 0.38% by mass and less than or equal to 0.55% by mass, and
in a cross-sectional view,
  centers of gravity of cross-sectional regions of respective tin linear bodies each resulting from the plurality of tin wires are positioned to form a substantially planar lattice, and
  an average distance from a center of gravity of a unit cell forming the substantially planar lattice to each center of gravity of the cross-sectional region of each of the tin linear bodies on lattice points of the unit cell is greater than or equal to 30 μm and less than or equal to 50 μm.

As a result of earnest studies made by the present inventors, it was found that a diffusion distance of tin in a heat treatment of the precursor is about 50 μm and that from tin, coarse $Nb_3Sn$ grains are generated at a site far away from the diffusion distance, thereby facilitating a reduction in the critical current density of the superconducting wire. Accordingly, with regard to the precursor of the aspect of the present invention, in the cross-sectional view, the centers of gravity of the cross-sectional regions of respective tin linear bodies each resulting from the plurality of tin wires are positioned to form the substantially planar lattice, and the average distance from the center of gravity of the unit cell forming the substantially planar lattice to each center of gravity of the cross-sectional region of each of the tin linear bodies on the lattice points of the unit cell is made to fall within the above range. Since the composite wire group of the composite pipe has a structure in which the plurality of niobium wires contact the periphery of the tin wires, with regard to the precursor, being the drawn wire product of the composite pipe: niobium linear bodies each resulting from the niobium wires are positioned within an area falling under a range being equal to or less than the upper limit from the tin linear bodies, thereby enabling a sufficient amount of tin to be dispersed throughout the niobium linear bodies in the heat treatment by the internal tin process. In other words, the precursor enables: preventing insufficiency of a dispersion amount of tin in the site far away from the tin linear bodies; encouraging generation of fine and equiaxial $Nb_3Sn$ grains, which are to be magnetic flux pinning sites; and suppressing generation of coarse $Nb_3Sn$ grains, which have low magnetic flux pinning force, thereby enabling the superconducting wire having improved critical current density to be obtained. Furthermore, since the composite wire group contains titanium, and the content of titanium falls within the above range, the precursor enables improving the critical current density, particularly in the strong magnetic field, while preventing reduction in the generation amount of $Nb_3Sn$ for the superconducting wire to be obtained.

Another aspect of the invention made for solving the aforementioned problems is a production method of a precursor to be used in manufacturing a $Nb_3Sn$ superconducting wire by an internal tin process, the production method including:
preparing a composite pipe having:
a composite wire group;
a cylindrical barrier layer being disposed such that the cylindrical barrier layer surrounds the composite wire group to prevent permeation of tin; and
a cylindrical protective layer covering an outer circumferential surface of the cylindrical barrier layer,
and
drawing the composite pipe,
wherein
the composite wire group has:
a plurality of tin wires each having at least one tin core being made of tin or a tin alloy, and a copper matrix which surrounds the at least one tin core; and
a plurality of niobium wires each having a plurality of niobium cores being made of niobium or a niobium alloy, and a copper matrix which surrounds the plurality of niobium cores, the plurality of niobium wires being disposed such that each of the tin wires is surrounded by the niobium wires,
the composite wire group contains titanium, and a content of titanium is greater than or equal to 0.38% by mass and less than or equal to 0.55% by mass, in a cross-sectional view of the composite pipe following the drawing, centers of gravity of cross-sectional regions of respective tin linear bodies each resulting from the plurality of tin wires are positioned to form a substantially planar lattice, and
in the drawing, the composite pipe is drawn such that an average distance from a center of gravity of a unit cell forming the substantially planar lattice to each center of gravity of the cross-sectional region of each of the tin linear bodies on lattice points of the unit cell is greater than or equal to 30 μm and less than or equal to 50 μm.

The precursor produced by the production method of a precursor of the another aspect of the invention has the same structure as the precursor of the one aspect of the invention; thus, the production method of a precursor enables the superconducting wire to be obtained having improved critical current density.

A yet another aspect of the invention made for solving the aforementioned problems is a superconducting wire having:
composite linear bodies each having a plurality of pores along a longitudinal direction, and containing at least $Nb_3Sn$ and copper;
a cylindrical barrier layer being disposed such that the cylindrical barrier layer surrounds the composite linear bodies to prevent permeation of tin; and
a cylindrical protective layer covering an outer circumferential surface of the cylindrical barrier layer,
wherein
in a cross-sectional view,
centers of gravity of cross-sectional regions of respective pores are positioned to form a substantially planar lattice, and
an average distance from a center of gravity of a unit cell forming the substantially planar lattice to each center of gravity of the cross-sectional region of each of the pores on lattice points of the unit cell is greater than or equal to 30 μm and less than or equal to 50 μm, and
the composite linear bodies comprise titanium, and a content of titanium is greater than or equal to 0.38% by mass and less than or equal to 0.55% by mass.

The superconducting wire of the yet another aspect of the invention can be easily produced by the internal tin process using the precursor of the one aspect of the invention. Moreover, with regard to the superconducting wire, since in the cross-sectional view, the centers of gravity of the cross-sectional regions of respective pores, each resulting from tin, are positioned to form the substantially planar lattice, and the average distance from the center of gravity of the unit cell forming the substantially planar lattice to each center of gravity of the cross-sectional region of each of the pores on the lattice points of the unit cell is made to fall within the above range, a sufficient amount of tin can be dispersed throughout the composite linear bodies according to the heat treatment by the internal tin process at a time of manufacturing. In other words, the superconducting wire prevents insufficiency of the dispersion amount of tin in the site far away from tin and suppresses generation of coarse $Nb_3Sn$ grains, indicating improved critical current density. Furthermore, since the composite linear bodies contain titanium, and the content of titanium falls within the above range, the superconducting wire contains a high amount of $Nb_3Sn$, and the critical current density is improved, particularly in the strong magnetic field.

Effects of the Invention

As described above, the aspects of the present invention enable providing: the precursor to be used in manufacturing the superconducting wire, the precursor enabling obtaining the superconducting wire having improved critical current density; the production method of the precursor; and the superconducting wire having improved critical current density.

DESCRIPTION OF EMBODIMENTS

Hereinafter, embodiments of the precursor, the production method of a precursor, and the superconducting wire, each according to the present invention, are described in detail with reference to the drawings.

Figure 1:
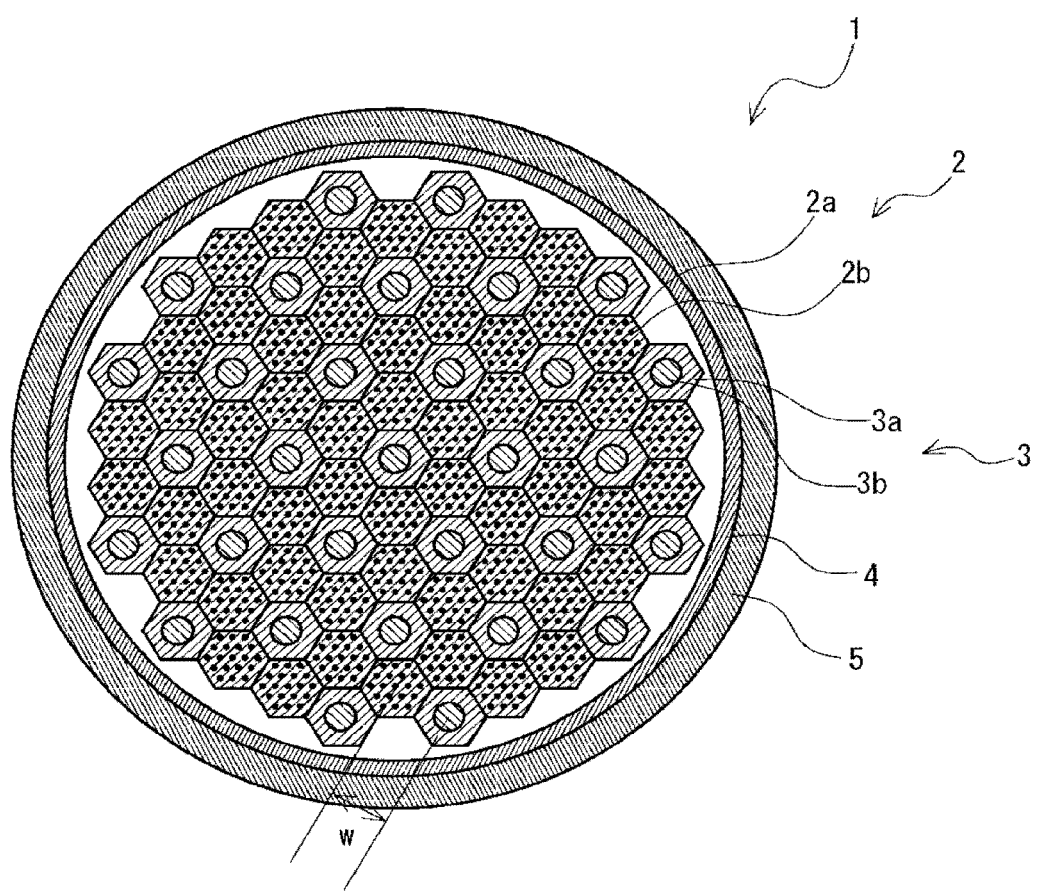
FIG. 1 is a cross-sectional view schematically illustrating a precursor of one embodiment of the present invention.

A precursor 1 in FIG. 1 is a superconducting wire precursor before a heat treatment, to be used in manufacturing a $Nb_3Sn$ superconducting wire by an internal tin process, and a cross-sectional region of the precursor 1 is formed to have a substantially circular cross-sectional region in a cross-sectional view. The precursor 1 is a drawn wire product of a composite pipe having: a composite wire group; a cylindrical barrier layer being disposed such that the cylindrical barrier layer surrounds the composite wire group to prevent permeation of tin; and a cylindrical protective layer covering an outer circumferential surface of the cylindrical barrier layer. As referred to herein, "drawn wire product of the composite pipe" refers to a molded product in a state in which a diameter of a composite pipe is reduced in a radial direction by wire drawing, and means a product in which, after the wire drawing, a change in structural arrangement aside from the reduction in diameter is small compared to that before the wire drawing.

Composite Pipe

The composite pipe before the wire drawing is formed to have a substantially circular cross-sectional region in a cross-sectional view, and has a structure in which a composite wire group is inserted into an inner side of a cylindrical body in which the barrier layer is cylindrically disposed on an inner circumferential surface of the cylindrical protective layer. It is to be noted that as a material of the barrier layer, for example, niobium and/or titanium is/are employed, and in light of enabling generation of $Nb_3Sn$ also on the inner circumferential surface of the barrier layer, niobium is preferred.

Composite Wire Group

The composite wire group has: a plurality of tin wires each containing a tin core being made of tin or a tin alloy, and a copper matrix which surrounds the tin core; and a plurality of niobium wires each containing a plurality of niobium cores being made of niobium or a niobium alloy, and a copper matrix which surrounds the plurality of niobium cores, the plurality of niobium wires being disposed such that each of the tin wires is surrounded by the niobium wires. Each of the tin wires and the niobium wires is formed to have a substantially regular hexagonal cross-sectional region in a cross-sectional view, and the wires are combined such that spatially, there are substantially no spaces. Specifically, the tin wires and the niobium wires are combined such that: three of each of the niobium wires and the tin wires alternately contact six faces of one niobium wire, and one niobium wire contacts each of six faces of one tin wire; thus, the copper matrix of the niobium wires and the copper matrix of the tin wires contact each other.

The tin wires in the composite wire group are positioned with regularity according to such a combination of tin wires and niobium wires as described above. Specifically, in a cross-sectional view of the composite pipe, centers of gravity of the cross-sectional regions of respective tin wires are positioned to form a substantially planar lattice (a substantially triangular lattice). Furthermore, in the cross-sectional view of the composite pipe, the centers of gravity of the cross-sectional regions of respective tin wires are substantially congruent with centers of gravity of cross-sectional regions of respective tin cores each included in the respective tin wires.

The composite wire group contains titanium (Ti). The titanium can be contained evenly in each of the tin wires and the niobium wires, but is preferably contained in the tin cores. In other words, the tin cores are preferably made of an alloy of tin and titanium. By including titanium in the tin cores, dispersion of tin is promoted, thereby enabling improving the critical current density.

The lower limit of a content of titanium with respect to the composite wire group as a whole is typically 0.38% by mass, and preferably 0.4% by mass. On the other hand, the upper limit of the content of titanium is typically 0.55% by mass, and preferably 0.5% by mass. When the content of titanium is less than the lower limit, it may not be possible to sufficiently obtain the effect of improving the critical current density by means of titanium in the superconducting wire to be obtained. Conversely, when the content of titanium is greater than the upper limit, the generation of $Nb_3Sn$ may be inhibited, and superconductivity of the superconducting wire to be obtained may degrade.

In the case of including titanium in the composite wire group by using the tin cores made of an alloy of tin and titanium, a content of titanium in the tin cores made of the alloy may be determined such that the content of titanium with respect to the composite wire group as a whole is a desired value. Specifically, the content of titanium in the tin cores made of the alloy is preferably greater than or equal to 1% by mass, and less than or equal to 2% by mass.

Production Method of Precursor

The production method of a precursor of the present invention is employed to produce the precursor 1, which is to be used in manufacturing the $Nb_3Sn$ superconducting wire by the internal tin process. The production method includes: a preparing step of preparing a composite pipe, and a drawing step of drawing the composite pipe.

Preparing Step

The preparing step is a step of preparing the composite pipe. In the preparing step, a composite pipe is prepared, the composite pipe having: a composite wire group; a cylindrical barrier layer being disposed such that the cylindrical barrier layer surrounds the composite wire group to prevent permeation of tin; and a cylindrical protective layer covering an outer circumferential surface of the cylindrical barrier layer.

The composite wire group of the composite pipe prepared has, as described above: a plurality of tin wires each containing at least one tin core being made of tin or a tin alloy, and a copper matrix which surrounds the at least one tin core; and a plurality of niobium wires each containing a plurality of niobium cores being made of niobium or a niobium alloy, and a copper matrix which surrounds the plurality of niobium cores, the plurality of niobium wires being disposed such that each of the tin wires is surrounded by the niobium wires.

Furthermore, as described above, the composite wire group contains titanium, and the content of titanium is greater than or equal to 0.38% by mass and less than or equal to 0.55% by mass.

Drawing Step

The drawing step is a step in which the composite pipe prepared in the preparing step is drawn, thereby giving the precursor 1. In the drawing step, the diameter of the composite pipe is reduced in a radial direction by wire drawing. As the wire drawing, a known drawing procedure using a die may be employed.

With regard to the composite pipe after the wire drawing (the precursor 1), a change in structural arrangement aside from the reduction in diameter is small compared to the composite pipe before the wire drawing. Thus, with regard to niobium linear bodies 2 each resulting from the plurality of niobium wires and tin linear bodies 3 each resulting from the plurality of tin wires, in the precursor 1, the structural arrangements of the plurality of niobium wires and the plurality of tin wires are each maintained in original states thereof aside from the reduction in diameter. In other words, in a cross-sectional view of the composite pipe after the drawing step, centers of gravity of cross-sectional regions of respective tin linear bodies 3 each resulting from the plurality of tin wires correspond to the arrangement of the plurality of tin wires, being positioned to form the substantially planar lattice (the substantially triangular lattice).

Furthermore, in the drawing step, a structural arrangement of the tin linear bodies 3 each resulting from the plurality of tin wires is adjusted by the reduction in diameter. Specifically, in the drawing step, the composite pipe is drawn such that an average distance W from a center of gravity of a unit cell forming the substantially planar lattice to each center of gravity of the cross-sectional region of each of the tin linear bodies 3 on lattice points of the unit cell is adjusted to a value suitable for dispersion of tin in the heat treatment. As referred to herein, the "average distance W" means a value determined by: obtaining distances from respective lattice points to a center of gravity with respect to five arbitrary unit cells; and averaging these distances.

It is to be noted that in the case of the precursor 1, due to the form of the cross-sectional region of each of the tin linear bodies 3 resembling a regular hexagon and the form of the unit cell resembling a regular triangle, a well-known procedure such as shape matching or the like using photo micrographic images may be employed as an extraction procedure of the unit cell and the cross-sectional region of each of the tin linear bodies 3.

The lower limit of the average distance W is typically 30 μm, preferably 33 μm, and more preferably 35 μm. On the other hand, the upper limit of the average distance W is typically 50 μm, preferably 47 μm, and more preferably 45 μm. When the average distance W is less than the lower limit, the wire drawing itself may be difficult, and/or cost of the wire drawing may increase. Conversely, when the average distance W exceeds the upper limit, the dispersion amount of tin from each of the tin linear bodies 3 to centers of gravity of the unit cells forming the planar lattice may be insufficient, and generation of coarse $Nb_3Sn$ grains at centers of gravity of the unit cells may not be suppressed.

Precursor

Since the precursor 1 is the drawn wire product of the composite pipe, the precursor 1 inherits the structural arrangement of the composite pipe before the drawing aside from the reduction in diameter. Specifically, the precursor 1 has: the plurality of the niobium linear bodies 2 each resulting from the plurality of niobium wires; and the plurality of the tin linear bodies 3 each resulting from the plurality of tin wires, and has a structure in which six of the niobium linear bodies 3 contact one tin linear body 3. Furthermore, the precursor 1 has a cylindrical barrier layer 4 being disposed such that the cylindrical barrier layer 4 surrounds the plurality of the niobium linear bodies 2 and the plurality of the tin linear bodies 3 to prevent permeation of tin; and a cylindrical protective layer 5 covering an outer circumferential surface of the cylindrical barrier layer 4. It is to be noted that FIG. 1 is illustrated as if the precursor 1 had a space in the inner circumferential surface side of the cylindrical barrier 4; however, FIG. 1 is a schematic cross-sectional view having the purpose of facilitating understanding of the structure of the precursor 1, and in actuality, this space is closed by the wire drawing when producing the precursor 1.

Niobium Linear Bodies

The niobium wires before the wire drawing each result in the niobium linear bodies 2, and these niobium linear bodies 2 are each formed from: a copper matrix 2a, and a plurality of niobium core bodies 2b each being made of niobium or a niobium alloy and being surrounded by the copper matrix 2a. The plurality of niobium core bodies 2b are to be arranged in a state of being apart from each other due to the copper matrix 2a, and a number and arrangements thereof are not particularly limited.

Tin Linear Bodies

The tin wires before the wire drawing each result in the tin linear bodies 3, and these tin linear bodies 3 are each formed from: a copper matrix 3a, and a tin core body 3b being made of tin or a tin alloy and being surrounded by the copper matrix 3a. It is to be noted that the tin linear body 3 is not limited to one having a single tin core body 3b, and one tin linear body 3 may have a plurality of tin core bodies 3b.

Each of the niobium linear bodies 2 and the tin linear bodies 3 is formed to have a substantially regular hexagonal cross-sectional region in a cross-sectional view, and the wires are combined such that spatially, there are substantially no spaces. Furthermore, as illustrated in FIG. 1, three of each of the niobium linear bodies 2 and three of the tin linear bodies 2 alternately contact six faces of one of the niobium linear bodies 2, and one of the niobium linear bodies 2 contacts each of six faces of one of the tin linear bodies 3; thus, the copper matrix 2a of each of the niobium linear bodies 2 and the copper matrix 3a of each of the tin linear bodies 3 contact or join each other.

The tin linear bodies 3 are positioned with regularity according to the aforementioned combination of the niobium linear bodies 2 and the tin linear bodies 3. Specifically, in a cross-sectional view of the precursor 1, centers of gravity of the cross-sectional regions of respective tin linear bodies 3 are positioned to form a substantially planar lattice (a substantially triangular lattice). Furthermore, in the cross-sectional view of the precursor 1, the centers of gravity of the cross-sectional regions of respective tin linear bodies 3 are substantially congruent with centers of gravity of cross-sectional regions of respective tin core bodies 3b each included in the respective linear bodies 3.

The average distance W from a center of gravity of a unit cell forming the substantially planar lattice to each center of gravity of the cross-sectional region of each of the tin linear bodies 3 on lattice points of the unit cell is adjusted to a value suitable for dispersion of tin in the heat treatment. Specifically, the lower limit of the average distance W is typically 30 μm, preferably 33 μm, and more preferably 35 μm. On the other hand, the upper limit of the average distance W is typically 50 μm, preferably 47 μm, and more preferably 45 µm. When the average distance W is less than the lower limit, the wire drawing may become difficult, and/or the cost of the wire drawing may increase. Conversely, when the average distance W exceeds the upper limit, the dispersion amount of tin from the tin linear bodies 3 to centers of gravity of the unit cells forming the planar lattice may be insufficient, and the generation of coarse $Nb_3Sn$ grains at the centers of gravity of the unit cells may not be suppressed.

Barrier Layer

The barrier layer 4 is a layer that prevents tin, which is dispersed from the tin linear bodies 3 in the heat treatment by the internal tin process, from permeating outside, and is cylindrically formed such that the barrier layer 4 surrounds the plurality of the niobium linear bodies 2 and the plurality of the tin linear bodies 3. As a material of the barrier layer 4, for example, niobium and/or titanium are/is employed, and in light of enabling generation of $Nb_3Sn$ also on the inner circumferential surface of the barrier layer 4, niobium is preferred.

Protective Layer

The protective layer 5 is a stabilizer made of copper which protects the precursor 1, and is cylindrically formed such that the protective layer 5 covers an outer circumferential surface of the cylindrical barrier layer 4.

Superconducting Wire

Figure 2:
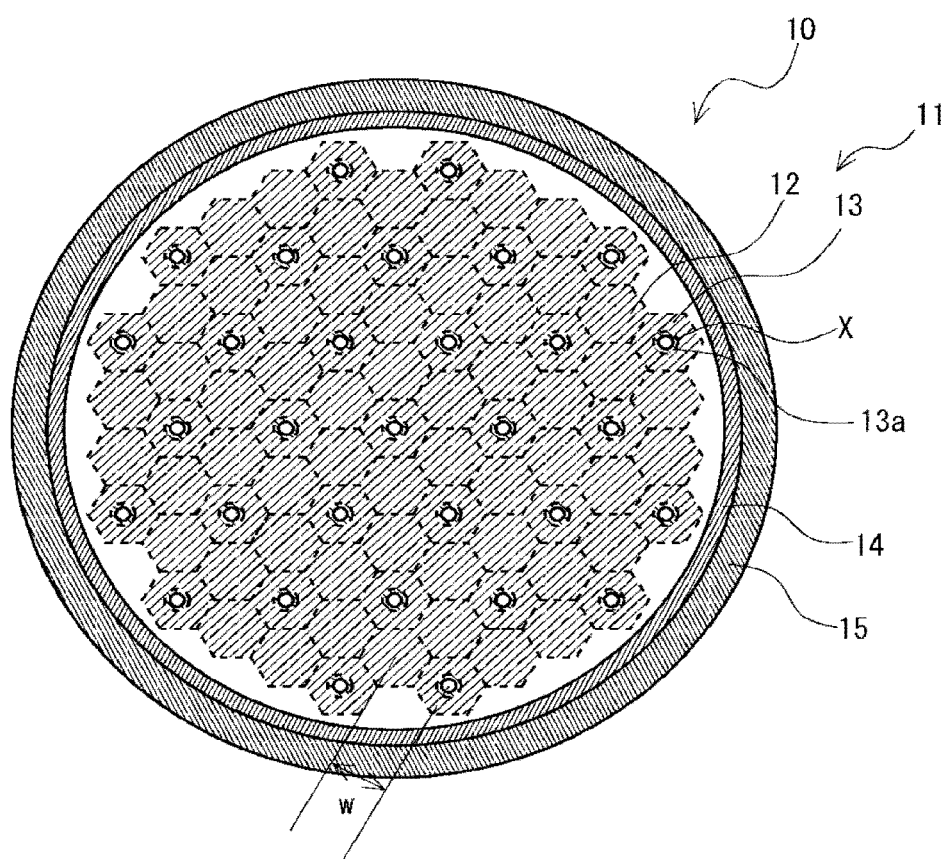
FIG. 2 is a cross-sectional view schematically illustrating a superconducting wire produced from the precursor in FIG. 1.

A superconducting wire 10 in FIG. 2 is a $Nb_3Sn$ superconducting wire, and is formed to have a substantially circular cross-sectional region in a cross-sectional view. The superconducting wire 10 can be manufactured by the internal tin process from the drawn wire product of the composite pipe, i.e., from the precursor 1. In this case, the superconducting wire 10 inherits the structural arrangement of the composite pipe before the drawing aside from the reduction in diameter. Specifically, the superconducting wire 10 has: composite linear bodies 11 each resulting from the composite wire groups; and a cylindrical barrier layer 14 being disposed such that the cylindrical barrier layer 14 surrounds the composite linear bodies 11 to prevent permeation of tin; and a cylindrical protective layer 15 covering an outer circumferential surface of the cylindrical barrier layer 14. It is to be noted that FIG. 2 is illustrated as if the superconducting wire 10 had a space in the inner circumferential surface side of the cylindrical barrier 14; however, FIG. 2 is a schematic cross-sectional view having the purpose of facilitating understanding of the structure of the superconducting wire 10, and in actuality, this space is closed. Hereinafter, the case of production by the internal tin process from the precursor 1 will be described as an example, but the superconducting wire 10 may be manufactured by another process.

Moreover, with regard to the superconducting wire 10, in conducting the heat treatment on the precursor 1 by the internal tin process, tin contained in the tin linear bodies 3 of the precursor 1 disperses, and niobium contained in the niobium linear bodies 2 reacts with tin to become $Nb_3Sn$. In other words, the composite linear bodies 11 of the superconducting wire 10 contain $Nb_3Sn$.

Composite Linear Bodies

The superconducting wire 10 has the composite linear bodies 11, which have a plurality of pores X along a longitudinal direction, and contains at least $Nb_3Sn$ and copper. The composite linear bodies 11 are formed from: a plurality of the niobium linear bodies 12 each resulting from the niobium linear bodies 2; and a plurality of the tin linear bodies 13 each resulting from the tin linear bodies 3, and six niobium linear bodies 12 contact one tin linear body 13. It is to be noted that the plurality of the niobium linear bodies 12 and the plurality of the tin linear bodies 13 are fused together as an aggregate whole; thus, the composite linear bodies 11 have a structure in which it is difficult to distinguish boundaries of each of the niobium linear bodies 12 and the tin linear bodies 13, and to clearly discriminate between $Nb_3Sn$ and copper.

Furthermore, the composite linear bodies 11 contain titanium. As described above, in the precursor 1, of the composite wire group of the composite pipe before the wire drawing, titanium is preferably contained in the tin cores, but even in the case in which titanium is thus contained in the tin cores, at the time of conducting the heat treatment of the precursor 1, titanium is dispersed together with tin, and introduced into $Nb_3Sn$. Since titanium is thus contained in $Nb_3Sn$ even in the composite linear bodies 11, improving the critical current density in the strong magnetic field is enabled due to improvement of an upper critical magnetic field. It is to be noted that the "strong magnetic field" as referred to herein means a magnetic field of greater than or equal to 15 T (teslas).

The lower limit of a content of titanium in the composite linear bodies 11 is typically 0.38% by mass, and preferably 0.4% by mass. On the other hand, the upper limit of the content of titanium is typically 0.55% by mass, and preferably 0.5% by mass. When the content of titanium is less than the lower limit, it may not be possible to sufficiently obtain the effect of improving the critical current density by means of titanium in the superconducting wire 10. Conversely, when the content of titanium is greater than the upper limit, the generation of $Nb_3Sn$ is inhibited, and superconductivity of the superconducting wire 10 may degrade.

Pores

The pores X each result from the tin linear bodies 3 of the precursor 1. As described above, according to the heat treatment by the internal tin process, a majority of tin disperses from the tin linear bodies 3 of the precursor 1. Thus, pores X are formed in the tin linear bodies 13 resulting from the arrangement of the tin core bodies $3b$ of the tin linear bodies 3 of FIG. 1. However, as described above, the niobium linear bodies 12 and the tin linear bodies 13 are the aggregate whole; thus, in actuality, as shown in FIG. 2, the composite linear bodies 11 are observed to have the plurality of pores X along the longitudinal direction.

It is to be noted that in a case in which a part of tin contained in the tin core bodies $3b$ of the precursor 1 remains without dispersing, a tin adhesion layer $13a$ is formed on inner circumferential surfaces of the pores X as shown in FIG. 2.

The pores X are positioned with regularity, owing to the arrangement of the niobium linear bodies 2 and the tin linear bodies 3 of the precursor 1. Specifically, in a cross-sectional view of the superconducting wire 10, centers of gravity of the cross-sectional regions of respective pores X are positioned to form a substantially planar lattice (a substantially triangular lattice).

The average distance W from a center of gravity of a unit cell forming the substantially planar lattice to each center of gravity of the cross-sectional region of each of the pores X on lattice points of the unit cell is adjusted to a value suitable for dispersion of tin in the heat treatment. Specifically, the lower limit of the average distance W is preferably 30 µm, more preferably 33 µm, and still more preferably 35 µm. On the other hand, the upper limit of the average distance W is preferably 50 µm, more preferably 47 µm, and still more preferably 45 µm. When the average distance W is less than the lower limit, at the time of producing the precursor 1 itself in order to manufacture the superconducting wire 10, the wire drawing may become difficult, and/or the cost of the wire drawing may increase. Conversely, when the average distance W exceeds the upper limit, the dispersion amount of tin from the tin linear bodies 3 of the precursor 1 before the heat treatment to the center of gravity of the unit cell forming the planar lattice may be insufficient, and the superconducting wire 10 may have coarse $Nb_3Sn$ grains in the center of gravity of the unit cell.

Advantages

With regard to the precursor 1, in the cross-sectional view, the centers of gravity of the cross-sectional regions of respective tin linear bodies 3 each resulting from the plurality of tin wires are positioned to form the substantially planar lattice, and the average distance from the center of gravity of the unit cell forming the substantially planar lattice to each center of gravity of the cross-sectional region of each of the tin linear bodies 3 on the lattice points of the unit cell is made to be greater than or equal to 30 μm and less than or equal to 50 μm. The composite wire group of the composite pipe has the structure in which the plurality of niobium wires contact the periphery of the tin wires; therefore, the precursor 1 being the drawn wire product of the composite pipe allows each of the niobium linear bodies 2 resulting from the niobium wires to be positioned less than or equal to 50 μm from each of the tin linear bodies 3, thereby enabling a sufficient amount of tin to be dispersed throughout the niobium linear bodies 2 in the heat treatment by the internal tin process. In other words, the precursor 1 enables: preventing insufficiency of the dispersion amount of tin in the site far away from the tin linear bodies 3; encouraging the generation of $Nb_3Sn$ grains, being fine and equiaxial grains which are to be magnetic flux pinning sites; and inhibiting the generation of coarse $Nb_3Sn$ grains, which have low magnetic flux pinning force, thereby enabling obtaining the superconducting wire 10, having improved critical current density. Furthermore, since the composite wire group contains titanium, and the content thereof falls within the above range, the precursor 1 enables improving the critical current density, particularly in the strong magnetic field, while preventing reduction in the generation amount of $Nb_3Sn$ for the superconducting wire to be obtained.

Moreover, with regard to the superconducting wire 10, in the cross-sectional view, the centers of gravity of the cross-sectional regions of respective pores X resulting from tin are positioned to form the substantially planar lattice, and the average distance from the center of gravity of the unit cell forming the substantially planar lattice to each center of gravity of the cross-sectional region of each of the pores X on the lattice points of the unit cell is made to be greater than or equal to 30 μm and less than or equal to 50 μm; therefore, a sufficient amount of tin can be dispersed throughout the composite linear bodies 11 according to the heat treatment by the internal tin process at the time of production. In other words, the superconducting wire 10 prevents insufficiency of the dispersion amount of tin in the site far away from tin and inhibits generation of coarse $Nb_3Sn$ grains, thereby indicating improved critical current density. Furthermore, since the composite linear bodies 11 contain titanium, and the content of titanium is greater than or equal to 0.38% by mass and less than or equal to 0.55% by mass, the superconducting wire 10 contains a high amount of $Nb_3Sn$, and the critical current density is improved, particularly in the strong magnetic field.

Other Embodiments

The precursor to be used in manufacturing a superconducting wire, the production method of a precursor, and the superconducting wire of the present invention are not limited to the above embodiments.

In the one embodiment of the present invention, the precursor having the niobium linear bodies and the tin linear bodies, with the forms of the cross-sectional regions thereof being the substantially regular hexagons in the cross-sectional view, is described; however, the forms of the cross-sectional regions in the cross-sectional view of each of the niobium linear bodies and the tin linear bodies are not limited to the form being substantially the regular hexagon, and may be, for example, a substantially equilateral triangle or a substantial square. Furthermore, resulting from the structure of the precursor, the superconducting wire may, in the cross-sectional view, be such that the centers of gravity of the cross-sectional regions of respective pores are positioned to form a substantially regular hexagonal lattice, or a substantially square lattice.

EXAMPLES

Hereinafter, the present invention is explained in further detail by way of Examples, but the present invention is not in any way limited to these Examples.

Example 1

Preparation of Composite Pipe

First, a core made of niobium was inserted into a copper pipe, and a niobium single-core wire having a regular hexagonal cross-section was produced by wire drawing. A length between opposing sides of the regular hexagon of the cross-section of the niobium single-core wire was 3.8 mm. The niobium single-core wire produced was cut into multiple pieces, then 583 strands of the niobium single-core wire were combined and inserted into the copper pipe, and a niobium wire having a regular hexagonal cross-section was produced by wire drawing. A length between opposing sides of the regular hexagon of the cross-section of the niobium wire was 3.5 mm.

Next, a core made of a tin-titanium alloy (content of titanium: 1.8% by mass) was inserted into the copper pipe, and a tin wire having a regular hexagonal cross-section was produced by wire drawing. A length between opposing sides of the regular hexagon of the cross-section of the tin wire was 3.5 mm. It is to be noted that a content of titanium in the core made of the tin-titanium alloy is an amount with which a content of titanium in composite linear bodies of a superconducting wire to be manufactured becomes 0.55% by mass.

The niobium wire and the tin wire obtained were cut into multiple pieces, and 84 niobium wires and 37 tin wires were combined such that each cross-section thereof was a form being substantially a circle to make a composite wire group. In this combination, these wires were arranged such that: a niobium wire contacts each of six faces of a tin wire, and three of each of the tin wires and the niobium wires alternately contact six faces of a niobium wire.

One roll of a sheet made of niobium was inserted into an inner circumferential surface of the copper pipe, and into a further inner side of the sheet in the copper pipe was inserted the composite wire group, whereby a composite pipe was formed.

Precursor and Superconducting Wire

The composite pipe obtained was integrated by wire drawing, and further, the wire drawing was advanced to produce a precursor. It is to be noted that a cross-sectional form and dimensions of the precursor after the wire drawing are decided by the structure of the composite pipe. Since in Example 1, the composite pipe is structured as described above, centers of gravity of cross-sectional regions of respective tin linear bodies each resulting from the plurality of tin wires are positioned to form a substantially triangular lattice. In a cross-sectional view, an average distance W from a center of gravity of a unit cell forming the substantially planar lattice to each center of gravity of cross-sectional regions of each of the tin linear bodies on lattice points of the unit cell is 48 μm, and a wire diameter of the precursor produced is 0.6 mm. It is to be noted the substantially triangular lattice form was confirmed for the positioning of the centers of gravity of the cross-sectional regions of respective tin linear bodies resulting from the plurality of tin wires by cutting the precursor produced and observing the cross-section with a microscope.

Further, a multi-step heat treatment by an internal tin process was performed on the precursor obtained to produce a superconducting wire of Example 1. With regard to the superconducting wire, under conditions of: a temperature of 4.2 K; and an external magnetic field of 16 T, a non-copper part critical current density was measured in a non-copper part, corresponding to a part excluding an area of a cross-sectional region of copper from an entire cross-sectional area. Measurement results are shown in Table 1.

Example 2

As the core made of the tin-titanium alloy, an alloy having a content of titanium being 1.5% by mass was used. It is to be noted that the content of titanium in the core made of the tin-titanium alloy is an amount with which a content of titanium in composite linear bodies of a superconducting wire to be manufactured becomes 0.44% by mass.

Furthermore, a length between opposing sides of the regular hexagon of the cross-section of the niobium wires and the tin wires was made to be 2.3 mm, an average distance W between the centers of gravity of the composite pipe after the wire drawing was made to be 32 μm, and a wire diameter of the precursor produced was made to be 0.8 mm.

A superconducting wire of Example 2 was manufactured similarly to that of Example 1, except for the above. Measurement results for a non-copper part critical current density of Example 2 are shown in Table 1.

Example 3

As the core made of the tin-titanium alloy, an alloy having a content of titanium being 1.2% by mass was used. It is to be noted that the content of titanium in the core made of the tin-titanium alloy is an amount with which a content of titanium in composite linear bodies of a superconducting wire to be manufactured becomes 0.38% by mass.

A superconducting wire of Example 3 was manufactured similarly to that of Example 2, except for the above. Measurement results for a non-copper part critical current density of Example 3 are shown in Table 1.

Comparative Example 1

A superconducting wire of Comparative Example 1 was manufactured similarly to that of Example 1, except that an average distance W between the centers of gravity of the composite pipe after the wire drawing was made to be 60 μm, and the wire diameter of the precursor produced was made to be 0.8 mm. Measurement results for a non-copper part critical current density of Comparative Example 1 are shown in Table 1.

TABLE 1

| | Wire diameter (mm) | Average distance W (μm) | Content of Ti (% by mass) | Non-copper part critical current density (A/mm$^2$) |
|---|---|---|---|---|
| Example 1 | 0.6 | 48 | 0.55 | 1,025 |
| Example 2 | 0.8 | 32 | 0.44 | 1,137 |
| Example 3 | 0.8 | 32 | 0.38 | 1,032 |
| Comparative Example 1 | 0.8 | 60 | 0.55 | 780 |

As shown in Table 1, for each of Examples 1 to 3, the non-copper part critical current density is greater than or equal to 1,000 A/mm$^2$, being greater than that of Comparative Example 1.

Furthermore, when the superconducting wires of Examples 1 to 3 and Comparative Example 1 were cut and cross-sections thereof were observed with the microscope, it was confirmed that: in Examples 1 to 3, crystal structures of Nb$_3$Sn revealed equiaxial grains, while in Comparative Example 1, a crystal structure of Nb$_3$Sn near a center of the triangular lattice, being the unit lattice, included coarse grains.

From the above results, it can be stated that improving the critical current density of the superconducting wire is enabled due to: allowing, in the cross-sectional view, the centers of gravity of the cross-sectional regions of respective pores resulting from tin to be positioned in the form of a substantially planar lattice; making the average distance from the center of gravity of the unit cell forming the substantially planar lattice to each center of gravity of the cross-sectional region of each of the pores on the lattice points of the unit cell, greater than or equal to 30 μm and less than or equal to 50 μm; and making the composite linear bodies contain Ti in the content of greater than or equal to 0.38% by mass and less than or equal to 0.55% by mass.

INDUSTRIAL APPLICABILITY

The present invention enables providing: a precursor to be used in manufacturing a superconducting wire, the precursor enabling obtaining the superconducting wire having improved critical current density; a production method of the precursor; and a superconducting wire having improved critical current density.

EXPLANATION OF THE REFERENCE SYMBOLS

1 Precursor
2 Niobium linear body
2a Copper matrix
2b Niobium core body
3 Tin linear body
3a Copper matrix
3b Tin core body 4 Barrier layer
5 Protective layer
10 Superconducting wire
11 Composite linear body
12 Niobium linear body
13 Tin linear body
13a Tin adhesion layer
14 Barrier layer
15 Protective layer
X Pores

The invention claimed is:

1. A precursor, which is a drawn wire product of a composite pipe,
wherein the composite pipe comprises:
a composite wire group;
a cylindrical barrier layer being disposed such that the cylindrical barrier layer surrounds the composite wire group to prevent permeation of tin; and
a cylindrical protective layer covering an outer circumferential surface of the cylindrical barrier layer, and
wherein the composite wire group comprises:
a plurality of tin wires each comprising a tin core made of tin or a tin alloy, and a copper matrix which surrounds the tin core;
a plurality of niobium wires each comprising a plurality of niobium cores made of niobium or a niobium alloy, and a copper matrix which surrounds the plurality of niobium cores, the plurality of niobium wires being disposed such that each of the tin wires is surrounded by the niobium wires; and
titanium in a range of from 0.38 to 0.55% by mass and the titanium is comprised evenly in each of the tin wires and the niobium wires, and
wherein, in a cross-sectional view,
centers of gravity of cross-sectional regions of respective tin linear bodies each resulting from the plurality of tin wires are positioned to form a substantially planar lattice, and
an average distance from a center of gravity of a unit cell forming the substantially planar lattice to each center of gravity of the cross-sectional region of each of the tin linear bodies on lattice points of the unit cell is in a range of from 35 to 50 µm.

2. The precursor of claim 1, wherein the composite wire group comprises titanium in a range of from 0.4 to 0.5% by mass.

3. The precursor of claim 1, wherein the tin core is made of a tin alloy comprising titanium in at least 1% by mass.

4. The precursor of claim 1, wherein the tin core is made of a tin alloy comprising titanium in at least 2% by mass.

5. The precursor of claim 1, wherein the average distance from the center of gravity of the unit cell forming the substantially planar lattice to each center of gravity of the cross-sectional region of each of the tin linear bodies on the lattice points of the unit cell is in a range of from 35 to 47 µm.

6. The precursor of claim 1, wherein the average distance from the center of gravity of the unit cell forming the substantially planar lattice to each center of gravity of the cross-sectional region of each of the tin linear bodies on the lattice points of the unit cell is in a range of from 35 to 45 µm.

7. A method for producing a precursor, the method comprising:
preparing a composite pipe comprising:
a composite wire group;
a cylindrical barrier layer being disposed such that the cylindrical barrier layer surrounds the composite wire group to prevent permeation of tin; and
a cylindrical protective layer covering an outer circumferential surface of the cylindrical barrier layer, and
drawing the composite pipe,
wherein the composite wire group comprises:
a plurality of tin wires each comprising a tin core made of tin or a tin alloy, and a copper matrix which surrounds the tin core;
a plurality of niobium wires each comprising a plurality of niobium cores made of niobium or a niobium alloy, and a copper matrix which surrounds the plurality of niobium cores, the plurality of niobium wires being disposed such that each of the tin wires is surrounded by the niobium; and
titanium in a range of from 0.38 to 0.55% by mass and the titanium is comprised evenly in each of the tin wires and the niobium wires,
wherein, in a cross-sectional view of the composite pipe following the drawing, centers of gravity of cross-sectional regions of respective tin linear bodies each resulting from the plurality of tin wires are positioned to form a substantially planar lattice, and
wherein, in the drawing, the composite pipe is drawn such that an average distance from a center of gravity of a unit cell forming the substantially planar lattice to each center of gravity of the cross-sectional region of each of the tin linear bodies on lattice points of the unit cell is in a range of from 35 to 50 µm.

8. The method of claim 7, wherein the composite wire group comprises titanium in a range of from 0.4 to 0.5% by mass.

9. The method of claim 7, wherein the tin core is made of a tin alloy comprising titanium in at least 1% by mass.

10. The method of claim 7, wherein the tin core is made of a tin alloy comprising titanium in at least 2% by mass.

11. The method of claim 7, wherein, in the drawing, the composite pipe is drawn such that the average distance from the center of gravity of a unit cell forming the substantially planar lattice to each center of gravity of the cross-sectional region of each of the tin linear bodies on the lattice points of the unit cell is in a range of from 35 to 47 µm.

12. The method of claim 7, wherein, in the drawing, the composite pipe is drawn such that the average distance from the center of gravity of a unit cell forming the substantially planar lattice to each center of gravity of the cross-sectional region of each of the tin linear bodies on the lattice points of the unit cell is in a range of from 35 to 45 µm.

13. A superconducting wire, comprising:
composite linear bodies each comprising a plurality of pores along a longitudinal direction, and comprising at least $Nb_3Sn$ and copper;
a cylindrical barrier layer being disposed such that the cylindrical barrier layer surrounds the composite linear bodies to prevent permeation of tin; and
a cylindrical protective layer covering an outer circumferential surface of the cylindrical barrier layer,
wherein, in a cross-sectional view,
centers of gravity of cross-sectional regions of respective pores are positioned to form a substantially planar lattice, and an average distance from a center of gravity of a unit cell forming the substantially planar lattice to each center of gravity of the cross-sectional region of each of the pores on lattice points of the unit cell is in a range of from 35 to 50 µm, and wherein the composite linear bodies comprise titanium in a range of from 0.38 to 0.55% by mass and the titanium is comprised evenly in each of the tin wires and the niobium wires.

14. The superconducting wire of claim 13, wherein the composite wire group comprises titanium in a range of from 0.4 to 0.5% by mass.

15. The superconducting wire of claim 13, wherein the tin core is made of a tin alloy comprising titanium in at least 1% by mass.

16. The superconducting wire of claim 13, wherein the tin core is made of a tin alloy comprising titanium in at least 2% by mass.

17. The superconducting wire of claim 13, wherein the average distance from the center of gravity of the unit cell forming the substantially planar lattice to each center of gravity of the cross-sectional region of each of the pores on the lattice points of the unit cell is in a range of from 35 to 47 µm.

* * * * *